(12) United States Patent
Lin

(10) Patent No.: US 9,130,186 B2
(45) Date of Patent: Sep. 8, 2015

(54) ORGANIC LIGHT EMITTING DIODE

(71) Applicant: Xiamen Tianma Micro-Electronics Co., Ltd., Xiamen (CN)

(72) Inventor: Wenjing Lin, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 13/898,053

(22) Filed: May 20, 2013

(65) Prior Publication Data

US 2014/0175388 A1 Jun. 26, 2014

(30) Foreign Application Priority Data

Dec. 21, 2012 (CN) .......................... 2012 1 0566239

(51) Int. Cl.
*H01L 51/50* (2006.01)
*H01L 51/00* (2006.01)

(52) U.S. Cl.
CPC .......... *H01L 51/504* (2013.01); *H01L 51/5044* (2013.01); *H01L 51/0059* (2013.01); *H01L 51/0072* (2013.01); *H01L 51/0081* (2013.01); *H01L 51/0085* (2013.01)

(58) Field of Classification Search
CPC ............ H01L 51/5016; H01L 51/5036; H01L 51/504; H01L 51/5044; H01L 2251/5376; H01L 51/5048; H01L 51/5012; H01L 51/5088; H01L 33/26

USPC .......................................................... 257/40
See application file for complete search history.

(56) References Cited

U.S. PATENT DOCUMENTS

| | | | |
|---|---|---|---|
| 2008/0224132 A1* | 9/2008 | Forrest et al. .................... | 257/40 |
| 2008/0286610 A1* | 11/2008 | Deaton et al. ................. | 428/704 |
| 2010/0084647 A1* | 4/2010 | Kondakova et al. ............ | 257/40 |
| 2010/0314648 A1* | 12/2010 | Fehrer et al. .................... | 257/98 |
| 2011/0303902 A1* | 12/2011 | Jou et al. ......................... | 257/40 |

FOREIGN PATENT DOCUMENTS

CN 102169965 A 8/2011

* cited by examiner

*Primary Examiner* — Whitney T Moore
(74) *Attorney, Agent, or Firm* — Alston & Bird LLP

(57) ABSTRACT

An organic light emitting diode is disclosed. The organic light emitting diode includes an anode, a hole transport layer, a light emitting layer, an electron transport layer, and a cathode. The light emitting layer includes a first phosphorescent light emitting layer, a first isolation layer, a blue fluorescent light emitting layer, a second isolation layer, and a second phosphorescent light emitting layer, which are stacked along a direction from the anode to the cathode. The first isolation layer is configured to conduct holes and to block electrons, and the second isolation layer is configured to conduct electrons and to block holes. The exciton recombination zone is constrained in the blue fluorescent light emitting layer, thus improving the light emitting efficiency and light stability of the organic light emitting diode.

19 Claims, 4 Drawing Sheets

ORGANIC LIGHT EMITTING DIODE

CROSS-REFERENCES TO RELATED APPLICATIONS

This application claims priority to Chinese patent application No. 201210566239.6 filed on Dec. 21, 2012 and titled "ORGANIC LIGHT EMITTING DIODE", which is incorporated herein by reference in its entirety.

BACKGROUND OF THE INVENTION

Technical Field

The present invention relates to display technologies, and in particular, to an organic light emitting diode.

An Organic Light Emitting Diode (OLED) emits light if a voltage is applied across an organic film, and is increasingly used in flat panel displays, illuminations, and backlights.

A White Organic Light Emitting Diode (WOLED) with a common phosphorescent material possesses poor stability due to the lack of a good dark blue phosphorescent material therein. Also, a WOLED of a structure with combined phosphorescence and fluorescence utilizes both singlet excitons and triplet excitons, but the singlet excitons (i.e. fluorescent excitons) are different from the triplet excitons (i.e. phosphorescent excitons) in terms of energy and a transfer property. In addition, a charge recombination zone changes depending on the voltage, so that the WOLED has a complex structure, a low energy utilization and a low light emitting efficiency. And more particularly, the optical spectrum of a WOLED device tends to significantly change according to applied voltage, which leads to a poor color stability.

BRIEF SUMMARY OF THE INVENTION

One inventive aspect is an organic light emitting diode, including an anode, a cathode, and a light emitting layer. The light emitting layer includes a first phosphorescent light emitting layer, a first isolation layer, configured to conduct holes and to block electrons, a blue fluorescent light emitting layer, a second isolation layer, configured to conduct electrons and to block holes, and a second phosphorescent light emitting layer. The first phosphorescent light emitting layer, the first isolation layer, the blue fluorescent light emitting layer, the second isolation layer, and the second phosphorescent light emitting layer are stacked in a direction from the anode to the cathode. The organic light emitting diode also includes a hole transport layer between the anode and the light emitting layer, and an electron transport layer between the light emitting layer and the cathode.

Another inventive aspect is an organic light emitting diode including an anode, a cathode, and a light emitting layer between the anode and the cathode. The light emitting layer includes a first phosphorescent light emitting layer, a first isolation layer, configured to conduct holes and to block electrons, a blue fluorescent light emitting layer, a second isolation layer, configured to conduct electrons and to block holes, and a second phosphorescent light emitting layer. The first phosphorescent light emitting layer, the first isolation layer, the blue fluorescent light emitting layer, the second isolation layer, and the second phosphorescent light emitting layer are stacked in a direction from the anode to the cathode.

DETAILED DESCRIPTION OF THE INVENTION

Various technical aspects of the present invention are described by way of certain example embodiments in conjunction with the accompanying drawings.

Figure 1:
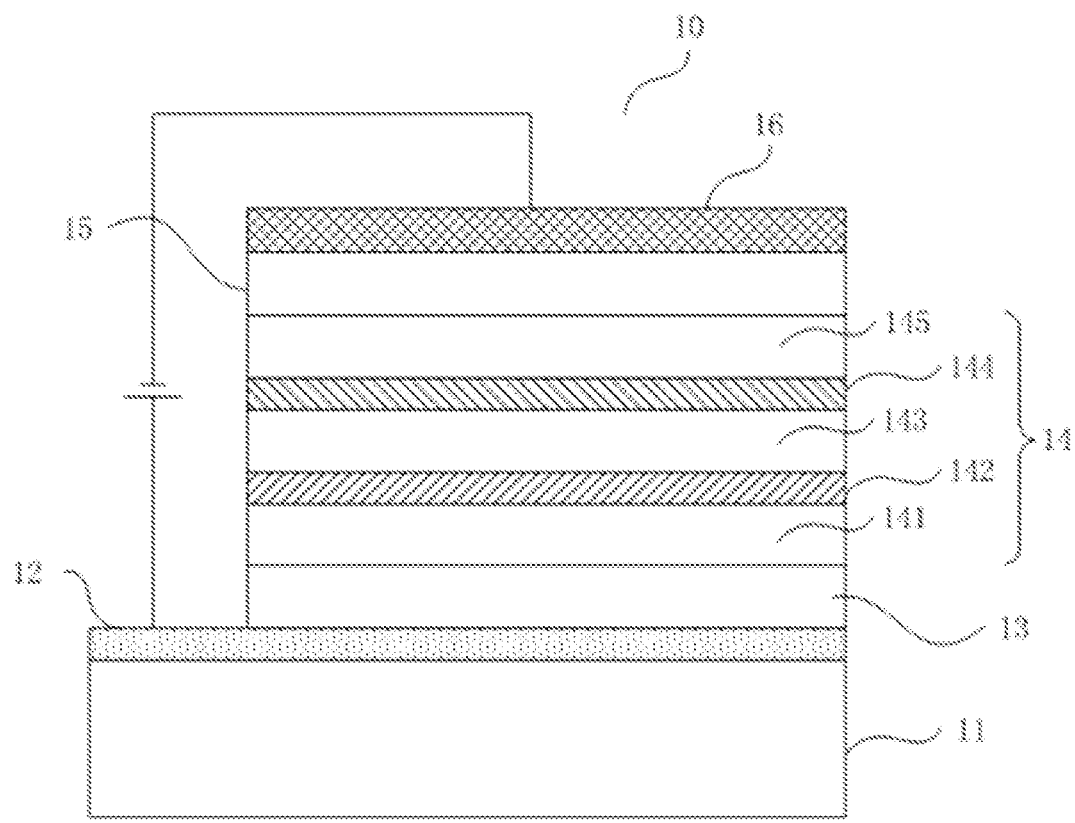
FIG. 1 is a schematic diagram of a structure of an OLED according to a first embodiment of the present invention.

FIG. 1 is a schematic diagram of a structure of an OLED according to a first embodiment of the present invention. As shown in FIG. 1, the OLED 10 includes a substrate 11, an anode 12, a hole transport layer 13, a light emitting layer 14, an electron transport layer 15, and a cathode 16, which are sequentially stacked.

The light emitting layer 14 includes a first phosphorescent light emitting layer 141, a first isolation layer 142, a blue fluorescent light emitting layer 143, a second isolation layer 144, and a second phosphorescent light emitting layer 145, which are sequentially stacked along a direction from the anode to the cathode.

The first isolation layer 142 is a layer of material which conducts holes and blocks electrons, and the second isolation layer 144 is a layer of material which conducts electrons and blocks holes.

When a current is applied to the OLED, holes are injected to the light emitting layer 14 from the anode 12 through the hole transport layer 13, and electrons are injected to the light emitting layer 14 from the cathode 16 through the electron transport layer 15. The injected holes and electrons are respectively transferred toward electrodes with opposite charges. When an electron and a hole are localized at the same molecule, they recombine and an "exciton", or a localized electron-hole pair of an excited energy state, is formed. Light is emitted due to a transition of the exciton from an excited state back to a ground state. When electrons and holes meet each other, their recombination results in excitons, of which 25% may be singlet excitons and 75% may be triplet excitons. The transition from the excited singlet state to the ground state causes emission of fluorescent light, and the transition from the excited triplet state to the ground state causes emission of phosphorescent light. The phosphorescent light emitting process includes a transition involving the change of spin multiplicity and is constrained by a spin factor. Thus, as a consequence its transition rate is much lower than the transition rate of the fluorescent light emitting process. Accordingly, the triplet exciton travels a longer distance due to its longer life. Further, the fluorescent material in the organic light emitting material emits fluorescent light by means of radiation attenuation of the singlet excitons, while the phosphorescent material in the organic light emitting material emits phosphorescent light by means of radiation attenuation of the triplet excitons.

In this embodiment, the first isolation layer 142 is configured to conduct holes and block electrons, and the second isolation layer 144 is configured to conduct electrons and block holes. The first isolation layer 142 is provided at the side of the blue fluorescent light emitting layer 143 away from the cathode, and the second isolation layer 144 is provided at the side of the blue fluorescent light emitting layer 143 away from the anode. Therefore, the holes injected from the anode into the blue fluorescent light emitting layer 143 can be blocked by the second isolation layer 144, and hence cannot reach the cathode. Likewise, the electrons injected from the cathode into the blue fluorescent light emitting layer 143 can be blocked by the first isolation layer 142, and hence cannot reach the anode. Thus, the electrons and the holes are restricted in the blue fluorescent light emitting layer 143 for combination, that is, the exciton recombination zone is constrained to the blue fluorescent light emitting layer 143, so that most excitons are generated in the blue fluorescent light emitting layer 143. In this case, the fluorescent excitons (i.e. singlet excitons) can be utilized by the fluorescent material in the blue fluorescent light emitting layer, since they cannot pass through the isolation layers to reach the phosphorescent light emitting layers due to their short lives. The phosphorescent excitons (i.e. triplet excitons), however, can be utilized by the phosphorescent material in the phosphorescent light emitting layer, since they can pass through the first or the second isolation layer due to their long lives which leads to long diffusion distances. Therefore, both the singlet excitons and the triplet excitons can be better utilized, thus improving the light emitting efficiency of the device.

Regarding the structure of the OLED, the thicknesses of the first isolation layer 142 and the second isolation layer 144 may be selected to control the distribution of the excitons (i.e., energy) in the light emitting layer, thereby controlling the brightness and other color characteristics in order to achieve a white balance or other desired effect.

Figure 2:
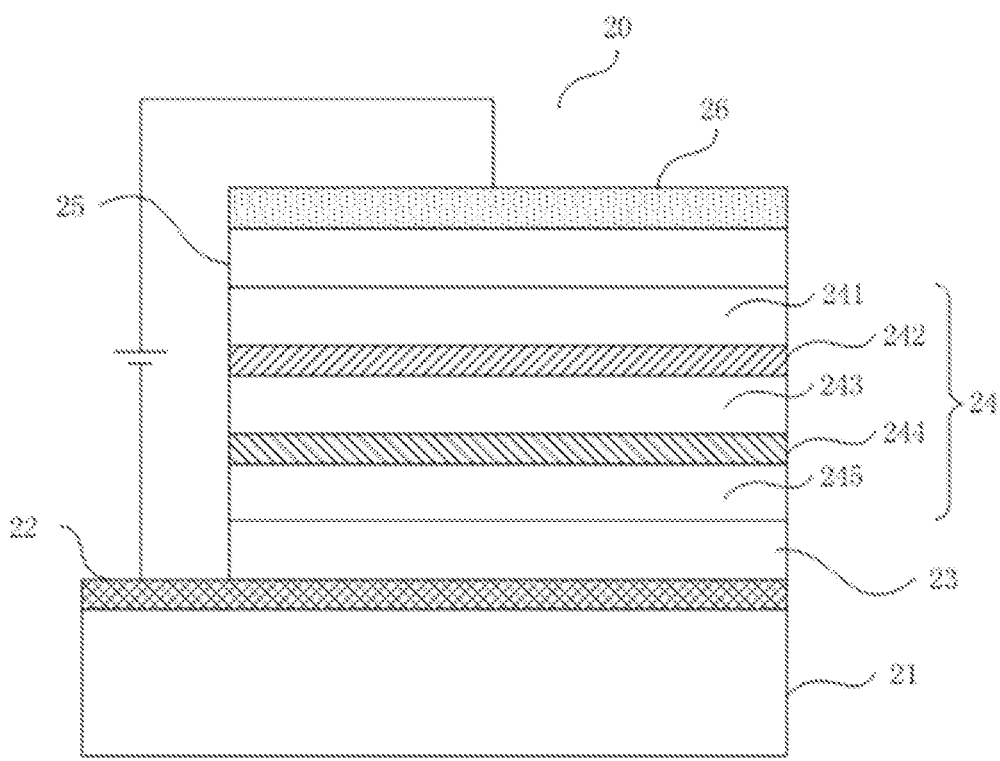
FIG. 2 is a schematic diagram of a structure the OLED according to another implementation of the first embodiment of the present invention.

In another implementation, as shown in FIG. 2, an OLED 20 includes a substrate 21, a cathode 22, an electron transport layer 23, a light emitting layer 24, a hole transport layer 25, and an anode 26, which are stacked. That is, the anode 26 is located on the top of the OLED 20. The OLED 20 may be referred to as an "inverted" OLED, since some OLEDs are constructed with a structure in which the cathode is located above the anode. The light emitting layer 24 includes a first phosphorescent light emitting layer 241, a first isolation layer 242, a blue fluorescent light emitting layer 243, a second isolation layer 244, and a second phosphorescent light emitting layer 245, which are stacked along a direction from the anode 26 to the cathode 21.

The first isolation layer 242 is a layer of material which conducts holes and blocks electrons, and the second isolation layer 244 is a layer of material which conducts of conducting electrons and blocks holes. In the "inverted" OLED, a metal layer, for example, with a thickness of 10-20 nm formed with one or more of Ag and Mg is employed as a transparent cathode, and a metal layer, for example, with a larger thickness formed by with one or more of Ag and Mg is employed as a semitransparent anode.

In this embodiment, by providing the isolation layers, current carriers are constrained in the blue fluorescent light emitting layer in which the fluorescent material is used as the light emitting body. accordingly, the exciton recombination zone is constrained in to blue fluorescent light emitting layer, so that the fluorescent excitons with a short diffusion distance are substantially all utilized by the blue fluorescent light emitting layer and the phosphorescent excitons with a longer diffusion distance are substantially all utilized by the phosphorescent light emitting layer. As a result, the excitons are isolated to corresponding light emitting layers and the light emitting efficiency and light stability of the OLED are improved.

Figure 3:
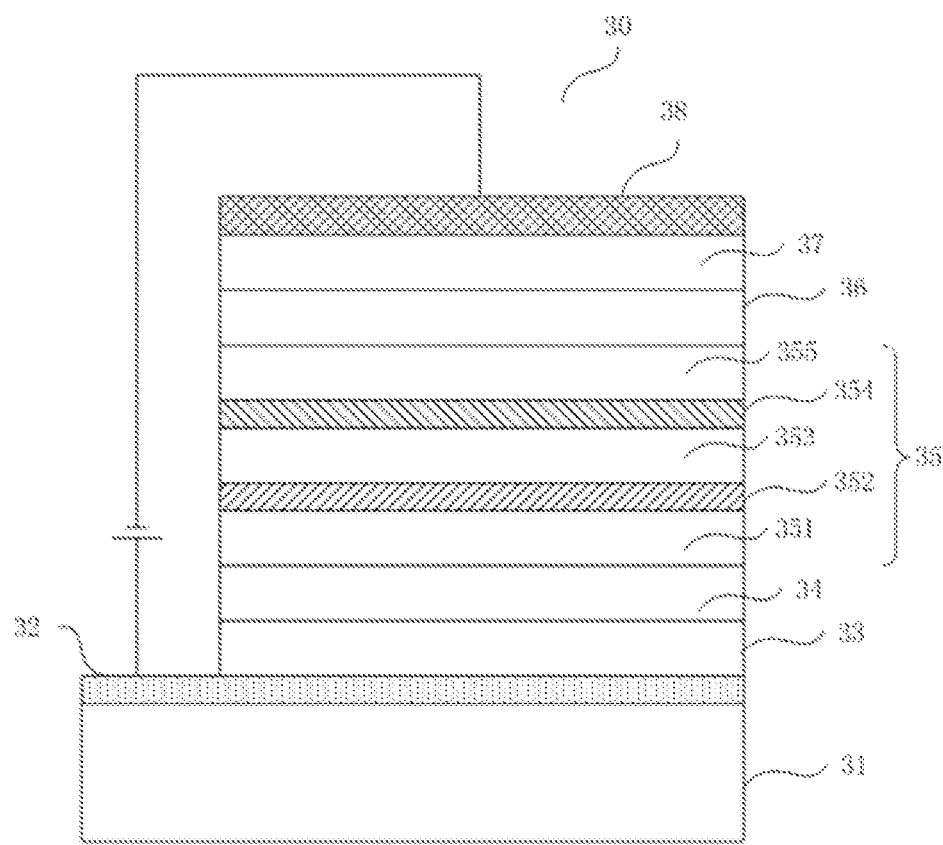
FIG. 3 is a schematic diagram of a structure of the OLED according to another embodiment of the present invention.

FIG. 3 is a schematic diagram of the structure of an OLED according to another embodiment of the present invention. As shown in FIG. 3, the OLED 30 includes a substrate 31, an anode 32, a hole injection layer 33, a hole transport layer 34, a light emitting layer 35, an electron transport layer 36, an electron injection layer 37, and a cathode 38, which are stacked.

The light emitting layer 35 is formed with a composite structure, which includes a first phosphorescent light emitting layer 351, a first isolation layer 352, a blue fluorescent light emitting layer 353, a second isolation layer 354, and a second phosphorescent light emitting layer 365, which are stacked along a direction from the anode to the cathode.

The first isolation layer 352 is a layer of material which conducts holes and blocks electrons, and the second isolation layer 355 is a layer of material which conducts electrons and blocks holes.

In the present embodiment, the anode 32 includes a film of Indium Tin Oxide (ITO), Indium Zinc Oxide (IZO), or one or more other transparent conductive materials.

In some embodiments, the hole injection layer 33 comprises 4,4',4"-tris(3-methylphenylphenylamino)-triphenylamine (m-MTDATA), and has a thickness of about 10 nm.

The hole transport layer 34 may be formed by 4,4'-cyclohexylidenebis[N,N-bis (4-methylphenyl)aniline] (TAPC), and has a thickness of about 30 nm.

In some embodiments, the electron transport layer 36 and electron injection layer 37 each are formed by 2,9-dimethyl-4,7-diphenyl-1,10-phenanthroline (BCP), and have a thicknesses of about 30 nm.

The cathode 38 may be formed with a composite cathode structure, which is formed by a Lithium Fluoride (LiF) layer having a thickness of about 1 nm and an Aluminum (Al) layer thereon.

In some embodiments, the light emitting layer 35 is formed with a composite structure and includes a first isolation layer 352, which is preferably formed by 4,4',4"-tris(carbazol-9-yl)triphenylamine (TCTA) and has a thickness of 1-10 nm, and preferably a thickness of 8 nm.

The second isolation layer 355 may be formed by tris(8-hydroxyquinoline)aluminum (AlQ), and have a thickness of about 1-10 nm, for example, about 5 nm.

In some embodiments, the thicknesses of the first isolation layer and the second isolation layer may be selected to control the distribution of the excitons (i.e., energy) in the light emitting layer, thereby adjusting the brightness and other color characteristics, in order to achieve a white balance or other desired effect.

The first and the second phosphorescent light emitting layers may be of the same color or different colors. In some embodiments, the first phosphorescent light emitting layer is a red phosphorescent light emitting layer, which comprises an organic material obtained by doping a guest material of tris (2-phenylquinoline)Iridium (Ir(2-phq)$_3$) into a host material of 4,4'-N,N'-dicarbazol-biphenyl (CBP) at a molar ratio of about 8% (i.e., Ir (2-phq)$_3$: CBP is about 8%), and has a thickness of about 5-20 nm, for example, about 10 nm.

The second phosphorescent light emitting layer may be a green phosphorescent light emitting layer, which comprises an organic material obtained by doping a guest material of tris(2-phenylpyridine)iridium (Ir(ppy)$_3$) into a host material of 4,4'-N,N'-dicarbazol-biphenyl (CBP) at molar ratio of about 8% (i.e., Ir(ppy)$_3$: CBP is about 8%), and has a thickness of about 5-20 nm, for example, about 12 nm.

In some embodiments, the first and the second phosphorescent light emitting layers may be light emitting layers with a color complementary to blue, for example, yellow or red phosphorescent light emitting layers. If the OLED is intended to emit light of another desired color, the first and the second phosphorescent light emitting layers can also be primary-color light emitting layers which emit light to be combined with blue color to obtain the desired color.

It should be understood by those skilled in the art that, the materials and thicknesses thereof employed by the above OLEDs are illustrated merely for the exemplary description of the specific implementations of the present invention. Other alternative known materials with the same function may be selected by the skilled in the art based on a limited number of tests to form the corresponding material layers, and the thicknesses of the different layers in the composite light emitting layers may be adjusted to achieve the desired light effect.

Figure 4:
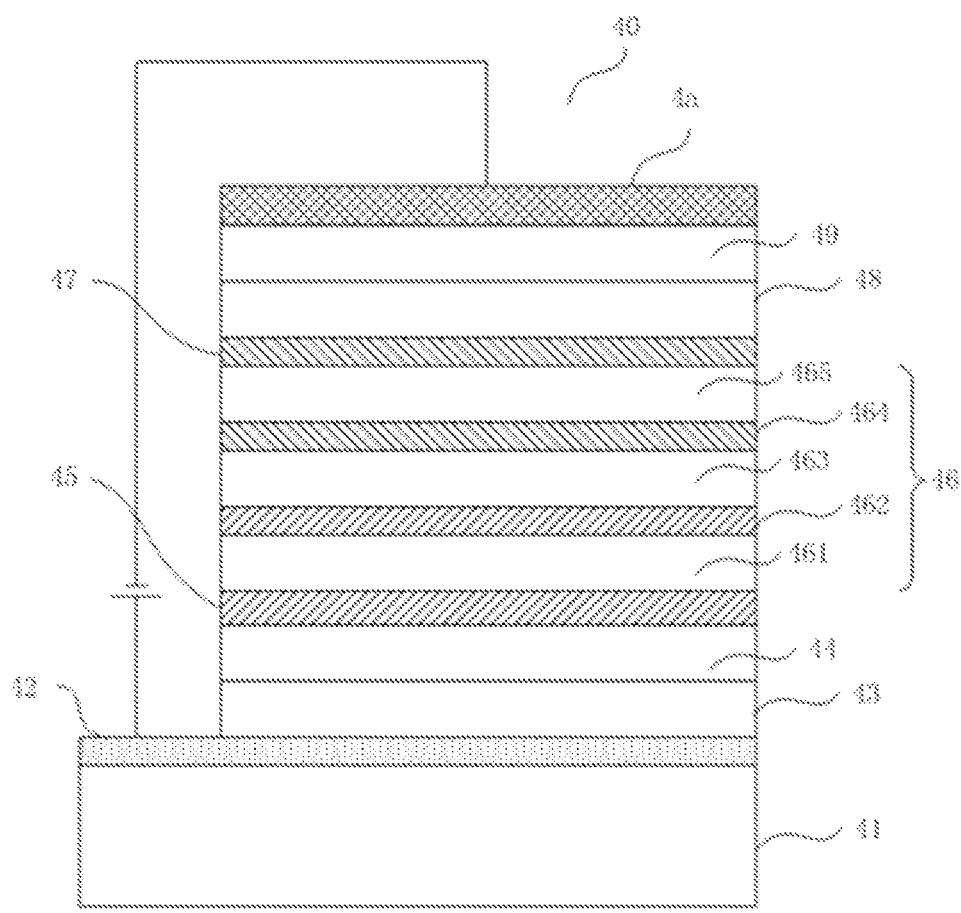
FIG. 4 is a schematic diagram of a structure of the OLED according to a third embodiment of the present invention.

FIG. 4 is a schematic diagram of a structure of an OLED according to a third embodiment of the present invention. As shown in FIG. 4, the OLED 40 includes a substrate 41, an anode 42, a hole injection layer 43, a hole transport layer 44, a first exciton constraining layer 45, a light emitting layer 46, a second exciton constraining layer 47, an electron transport layer 48, an electron injection layer 49, and a cathode 4a, which are stacked. That is, the OLED 40 according to the third embodiment is additionally provided with the first exciton constraining layer 45 and the second exciton constraining layer 47 compared with that of embodiments discussed above. The first exciton constraining layer 45 and the second exciton constraining layer 47 are a layer of material which conducts conducting holes and blocks electrons and a layer of material which conducts electrons and blocks holes, respectively. Thus, electrons traveling from the cathode toward the anode in FIG. 4, after being blocked by the first isolation layer of the light emitting layer 46, can also be blocked by the first exciton constraining layer 45 if passing through the first isolation layer, so that the electrons are recombined with the holes in the light emitting layer 46. Likewise, holes traveling from the anode toward the cathode in FIG. 4, after being blocked by the second isolation layer of the light emitting layer 46, can also be blocked by the second exciton constraining layer 47 to stay in the light emitting layer 46 for recombining with the electrons if passing through the second isolation layer. As a result, the light emitting efficiency of the OLED is further improved.

In this embodiment, by providing the first and the second exciton constraining layers, the exciton recombination zone is further constrained in the light emitting layer, thereby further improving the light emitting efficiency of the OLED.

The disclosed embodiments of the present invention have been described but are not intended to limit the invention. For those skilled in the art, various modifications and changes can be made for the present invention. Any modifications, equivalent replacements, improvements, etc. made within the principles of the present invention, should be included within the protection scope of the invention.

What is claimed is:

1. An organic light emitting diode, comprising:
    an anode;
    a cathode;
    a light emitting layer, comprising:
        a first phosphorescent light emitting layer,
        a first isolation layer comprising a first material which conducts holes and blocks electrons,
        a blue fluorescent light emitting layer,
        a second isolation layer comprising a second material which conducts electrons and blocks holes, wherein the second material is different from the first material, and
        a second phosphorescent light emitting layer,
    wherein the first phosphorescent light emitting layer, the first isolation layer, the blue fluorescent light emitting layer, the second isolation layer, and the second phosphorescent light emitting layer are sequentially stacked in a direction from the anode to the cathode;
    a hole transport layer between the anode and the light emitting layer; and
    an electron transport layer between the light emitting layer and the cathode,
    wherein the first phosphorescent light emitting layer comprises a host material of 4,4'-N,N'-dicarbazol-biphenyl (CBP) doped with a guest material of tris(2-phenylquinoline)iridium (Ir(2-phq)3) at a molar ratio of about 8%, and wherein the second phosphorescent light emitting layer comprises a host material of 4,4'-N,N'-dicarbazol-biphenyl (CBP) doped with a guest material of tris(2-phenylpyridine)iridium (Ir(ppy)3) at a molar ratio of about 8%.

2. The organic light emitting diode of claim 1, wherein, the blue fluorescent light emitting layer comprises 4,4'-bis(2,2-diphenylvinyl)biphenyl (DPVBi).

3. The organic light emitting diode of claim 2, wherein, the blue fluorescent light emitting layer has a thickness of a range from about 5 nm to about 20 nm.

4. The organic light emitting diode of claim 3, wherein, the blue fluorescent light emitting layer has a thickness of about 10 nm.

5. The organic light emitting diode of claim 1, wherein, the first and the second phosphorescent light emitting layers are of the same color.

6. The organic light emitting diode of claim 5, wherein both the first and the second phosphorescent light emitting layers are yellow or red phosphorescent light emitting layers.

7. The organic light emitting diode of claim 1, wherein, the first and the second phosphorescent light emitting layers are different colors.

8. The organic light emitting diode of claim 7, wherein:
    the first and the second phosphorescent light emitting layers are a red phosphorescent light emitting layer and a green phosphorescent light emitting layer, respectively; or
    the first and the second phosphorescent light emitting layers are a green phosphorescent light emitting layer and a red phosphorescent light emitting layer, respectively.

9. The organic light emitting diode of claim 8, wherein, the green phosphorescent light emitting layer has a thickness between about 5 nm and 20 nm, and the red phosphorescent light emitting layer has a thickness between about 5 nm and 20 nm.

10. The organic light emitting diode of claim 9, wherein, the green phosphorescent light emitting layer has a thickness of about 10 nm, and the red phosphorescent light emitting layer has a thickness of about 12 nm.

11. The organic light emitting diode of claim 1, wherein, the first isolation layer comprises 4,4',4"-tris(carbazol-9-yl)triphenylamine (TCTA), and the second isolation layer comprises Tris-(8-hydroxyquinoline)aluminum (AlQ).

12. The organic light emitting diode of claim 11, wherein, the first isolation layer and the second isolation layer have thicknesses of a range from about 1 nm to about 10 nm.

13. The organic light emitting diode of claim 12, wherein, the first isolation layer has a thickness of about 8 nm, and the second isolation layer has a thickness of about 5 nm.

14. The organic light emitting diode of claim 1, further comprising a hole injection layer between the anode and the hole transport layer, and an electron injection layer between the cathode and the electron transport layer.

15. The organic light emitting diode of claim 14, further comprising:

a first exciton constraining layer between the light emitting layer and the hole transport layer, wherein the first exciton constraining layer is configured to conduct holes and to block electrons; and a second exciton constraining layer between the light emitting layer and the electron transport layer, wherein the second exciton constraining layer is configured to conduct electrons and to block holes.

16. A method of manufacturing an organic light emitting diode, the method comprising:

forming an anode and a cathode on a substrate; and forming a light emitting layer between the anode and the cathode, the light emitting layer comprising:

a first phosphorescent light emitting layer, a first isolation layer comprising a first material which conducts holes and blocks electrons, a blue fluorescent light emitting layer, a second isolation layer comprising a second material which conducts electrons and blocks holes, wherein the second material is different from the first material, and a second phosphorescent light emitting layer, wherein the first phosphorescent light emitting layer, the first isolation layer, the blue fluorescent light emitting layer, the second isolation layer, and the second phosphorescent light emitting layer are sequentially stacked in a direction from the anode to the cathode, wherein the first phosphorescent light emitting layer comprises an organic material layer obtained by doping a guest material of tris(2-phenylpyridine)iridium (Ir(ppy)3) into a host material of 4,4'-N,N'-dicarbazol-biphenyl (CBP) at a molar ratio of about 8%, and the second phosphorescent light emitting layer is an organic material layer obtained by doping a guest material of tris(2-phenylquinoline)iridium (Ir(2-phq)3) into a host material of 4,4'-N,N'-dicarbazol-biphenyl (CBP) at a molar ratio of about 8%; or the second phosphorescent light emitting layer comprises an organic material layer obtained by doping a guest material of tris(2-phenylpyridine)iridium (Ir(ppy)3) into a host material of 4,4'-N,N'-dicarbazol-biphenyl (CBP) at a molar ratio of about 8%, and the first phosphorescent light emitting layer is an organic material layer obtained by doping a guest material of tris(2-phenylquinoline)iridium (Ir(2-phq)3) into a host material of 4,4'-N,N'-dicarbazol-biphenyl (CBP) at a molar ratio of about 8%.

17. The method of claim 16, wherein the blue fluorescent light emitting layer comprises 4,4'-bis(2,2-diphenylvinyl)biphenyl (DPVBi).

18. The method of claim 16, further comprising forming a hole injection layer between the anode and the light emitting layer, and forming an electron injection layer between the cathode and the light emitting layer.

19. The method of claim 18, further comprising:

forming a first exciton constraining layer between the light emitting layer and the anode, wherein the first exciton constraining layer is configured to conduct holes and to block electrons; and forming a second exciton constraining layer between the light emitting layer and the cathode, wherein the second exciton constraining layer is configured to conduct electrons and to block holes.

* * * * *